United States Patent [19]

Shiomi et al.

[11] Patent Number: 4,608,713
[45] Date of Patent: Aug. 26, 1986

[54] FREQUENCY CONVERTER

[75] Inventors: Yasufumi Shiomi, Suita; Yoshikazu Yoshimura, Takatsuki, both of Japan

[73] Assignee: Matsushita Electric Industrial Co., Ltd., Kadoma, Japan

[21] Appl. No.: 642,350
[22] PCT Filed: Jan. 13, 1984
[86] PCT No.: PCT/JP84/00004
§ 371 Date: Aug. 29, 1984
§ 102(e) Date: Aug. 29, 1984
[87] PCT Pub. No.: WO84/03008
PCT Pub. Date: Aug. 2, 1984

[30] Foreign Application Priority Data

Jan. 20, 1983 [JP] Japan ................... 58-8429
Feb. 18, 1983 [JP] Japan ................... 58-26532

[51] Int. Cl.$^4$ .............................. H04B 1/26
[52] U.S. Cl. ..................... 455/325; 455/328; 333/21 R
[58] Field of Search ............. 455/325, 328, 327; 333/104, 135, 137, 208, 21 R, 26

[56] References Cited

U.S. PATENT DOCUMENTS

| 3,230,484 | 1/1966 | Lipetz et al. | 333/21 R |
| 3,349,346 | 10/1967 | Enderby | 333/21 R |
| 3,787,787 | 1/1974 | Shimada et al. | 333/21 R |
| 4,000,469 | 12/1976 | McMaster | 455/327 |
| 4,418,430 | 11/1983 | Hulderman | 455/328 |
| 4,420,756 | 12/1983 | Hamada et al. | 333/135 |

FOREIGN PATENT DOCUMENTS

| 1100324 | 6/1984 | European Pat. Off. | 455/327 |
| 51-41306 | 11/1976 | Japan . | |
| 51-41283 | 11/1976 | Japan . | |
| 52-25054 | 7/1977 | Japan . | |
| 54-71916 | 6/1979 | Japan . | |

Primary Examiner—Jin F. Ng
Attorney, Agent, or Firm—Wenderoth, Lind & Ponack

[57] ABSTRACT

A frequency converter is constituted by an unobstructed circular waveguide unit through one end of which received signals are fed thereto and conveying signals in the TE11 mode, a rectangular waveguide unit having a rectangular waveguide microstrip line converter unit in its output end and conveying signals in the TE10 mode, a circular-rectangular waveguide converter unit connecting the output end of the circular waveguide unit and the rectangular waveguide unit to convert the mode of transmission of signals from the TE11 mode in the circular waveguide unit to a principal transmission mode TE10 in the rectangular waveguide unit, and a microwave integrated circuit extending in the direction of and being on the H-wall side of the circular-rectangular waveguide converter unit and the rectangular waveguide unit and connected to the rectangular waveguide-microstrip line converter unit for processing the received signals and delivering the received signals as signals of an intermediate frequency. The diameter of the circular waveguide unit is such as to cause the cutoff frequency of the circular waveguide unit to be lower than the frequency of the received signal and higher than the local oscillation frequency for causing the circular waveguide unit to function as a high pass filter, and the axis of the rectangular waveguide unit is offset relative to that of the circular waveguide unit in the direction parallel to the shorter side of the rectangular waveguide unit and toward the wall along which the microwave integrated circuit is positioned.

4 Claims, 20 Drawing Figures

FIG. 7A.
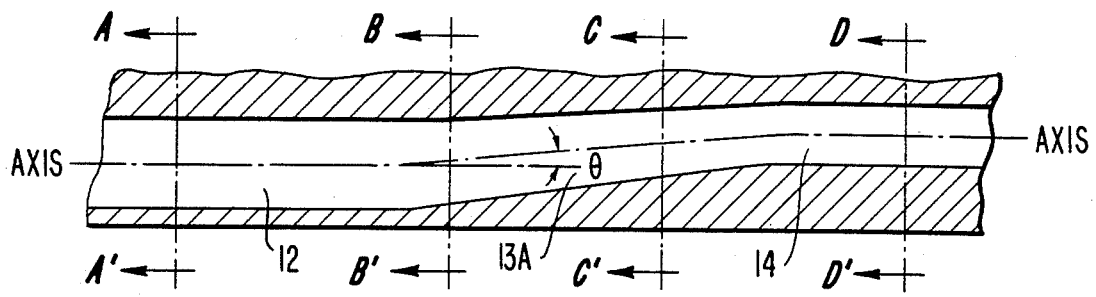
FIG. 7B.   FIG. 7C.   FIG. 7D.   FIG. 7E.
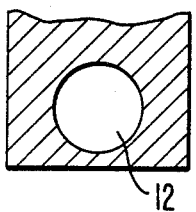 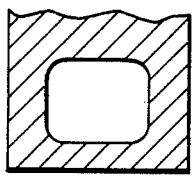 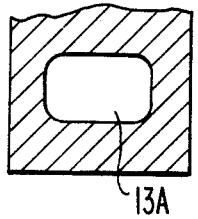 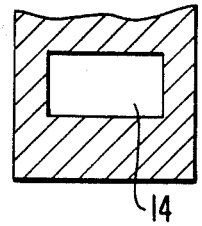
FIG. 8.
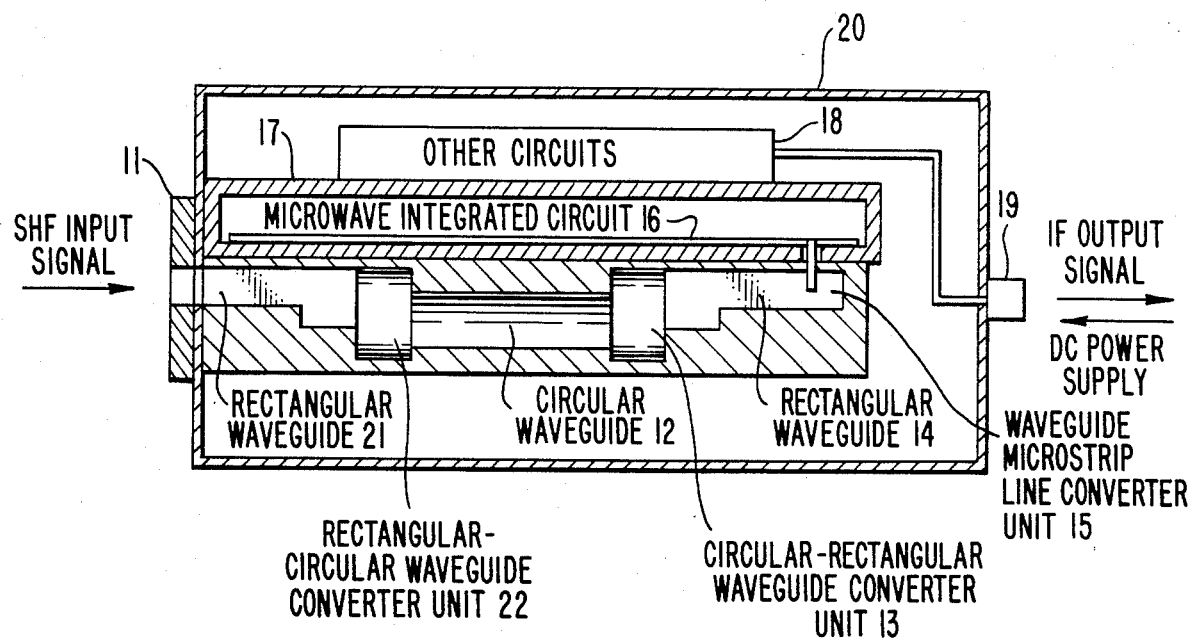

FREQUENCY CONVERTER

FIELD OF THE INVENTION

The present invention relates to a frequency converter intended to convert the frequency of an input signal of microwave into a lower frequency for use in a converter or the like for sateillite broadcast reception.

BACKGROUND OF THE INVENTION

Generally, a frequency converter for satellite communication wherein reception signals of the SHF band are fed through a waveguide is composed as shown in FIG. 1. That is, it consists of input flange unit 1 through which the SHF signal from the broadcast satellite is first applied, rectangular waveguide unit 2 which is provided in the final end of the rectangular waveguide and possesses a rectangular waveguide-microstrip line converter unit 3, microwave integrated circuit (MIC) 4 which is housed in a shield case 5 and which is responsible for processing of reception signals, and other attached circuits 6. Reference, numeral 7 designates an output terminal, and numeral 8 is an outer case which comprises the rectangular waveguide unit 2 having said rectangular waveguide-microstrip converter unit 3, microwave integrated circuit 4, shield case 5 and attached circuits 6.

In this construction, the SHF signal from the satellite supplied from the input flange unit 1 propagates through the rectangular waveguide unit 2 and enters the microwave integrated circuit 4 by way of rectangular waveguide-microstrip line converter unit 3. In this microwave integrated circuit 4, the signal is amplified and frequency-converted, and is delivered from the output terminal 7 as a signal of intermediate frequency.

As well known, the frequency converter for satellite communication is required to have a large image suppression ratio, small leakage of local oscillation frequency, and low noise index. In this respect, in the conventional constitution as shown in FIG. 1, the image suppression ratio and leakage of local oscillation signal were forced to depend only on the microwave integrated circuit 4, and there was a limit to the circuit design and satisfactory performance could not be obtained.

Another example of a conventional frequency converter is shown in FIG. 2, wherein the same numbers designate to the same parts as in FIG. 1. The converter in FIG. 2 is furnished with a waveguide type filter 9 in the rectangular waveguide unit 2 in order to satisfy the requirements of image suppression ratio and local oscillation signal leakage which were the defects in the conventional example shown in FIG. 1. The other construction is similar to that of FIG. 1.

In this construction, the performances of the image suppression ratio and local oscillation frequency may be sufficiently satisfied, but the insertion loss of said filter 9 exerts adverse effects on the noise index of the frequency converter, which is a serious defect.

DISCLOSURE OF THE INVENTION

The present invention is intended to provide a frequency converter which will satisfy not only the image suppression ratio and leakage prevention of local oscillation signal leakage, but also the noise index characteristic.

More particularly, the present invention provides a frequency converter which is reduced in size while satisfying all of said image suppression ratio, local oscillation signal leakage preventionn and noise index characteristic.

The frequency converter conforming to this invention comprises a circular waveguide unit, a rectangular waveguide comprises an unobstructed circular waveguide unit through one end of which received signals are fed thereto and conveying signals in the TE11 mode; a rectangular waveguide unit having a rectangular waveguide microstrip line converter unit in its output end and conveying signals in the TE10 mode; a circular-rectangular waveguide converter unit connecting the output end of said circular waveguide unit and said rectangular waveguide unit to convert the mode of transmission of signals from the TE11 mode in the circular waveguide unit to a principal transmission mode TE10 in the rectangular waveguide unit; and a microwave integrated circuit extending in the direction of and being on the H-wall side of said circular-rectangular waveguide converter unit and said rectangular waveguide unit and connected to said rectangular waveguide-microstrip line converter unit for processing the received signals and delivering the received signals as signals of an intermediate frequency; the diameter of said circular waveguide unit being such as to cause the cutoff frequency of said circular waveguide unit to be lower than the frequency of the received signal and higher than the local oscillation frequency for causing said circular waveguide unit to function as a high pass filter, and the axis of said rectangular waveguide unit being offset relative to that of said circular waveguide unit in the direction parallel to the shorter side of said rectangular waveguide unit and toward the wall along which said microwave integrated circuit is positioned.

BRIEF DESCRIPTION OF THE DRAWINGS

FIGS. 5A to 5E, FIGS. 6a, 6b, and FIGS. 7A to 7E are sectional views of examples of mutually different shapes of waveguide units of respective converters;

FIG. 8 is a sectional view of a frequency converter for satellite broadcast reception according to another embodiment.

PREFERRED EMBODIMENTS FOR THE EXECUTION OF THE INVENTION

Figure 1:
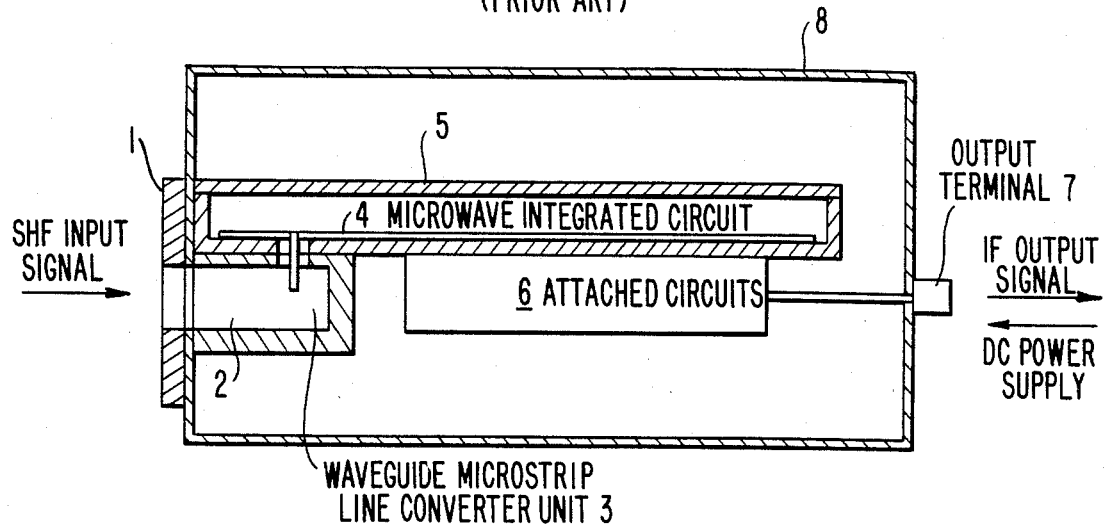
FIGS. 1 and 2 are sectional views showing the construction of conventional frequency converters for satellite broadcast reception.
Figure 2:
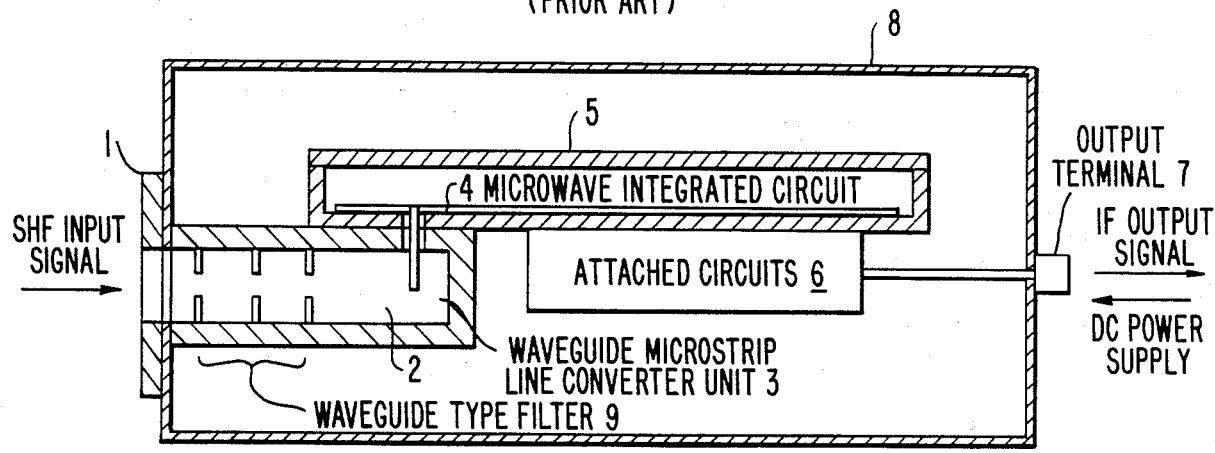

Referring now to the drawings, the frequency converter for satellite broadcast reception is described with respect to the embodiments of the present invention.

Figure 3:
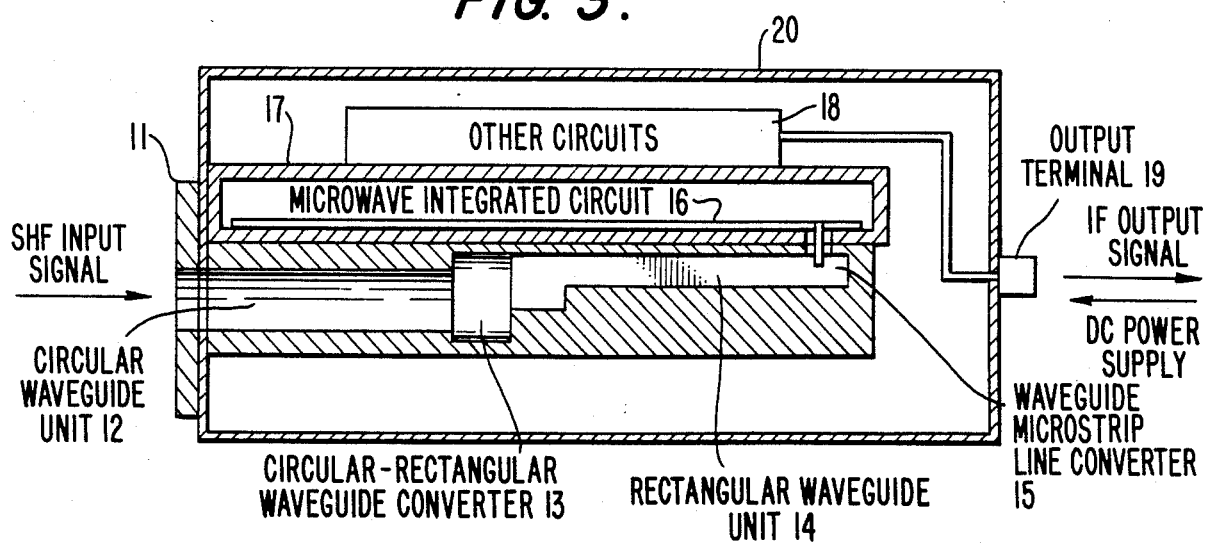
FIG. 3 is a sectional view showing the construction of a frequency converter for satellite broadcast reception according to one of the embodiments of the present invention.

One of the embodiments relates to a frequency converter for satellite broadcast reception, and an example of the construction thereof is shown in FIG. 3. In this diagram, there are input flange unit 11, circular waveguide unit 12, circular-rectangular waveguide converter unit 13, and rectangular waveguide unit 14 which has a rectangular waveguide-microstrip line converter unit 15 in its final end. Reference numeral 16 designates a microwave integrated circuit, 17 is a shield case to accommodate said circuit 16, 18 designates other circuits, 19 is an output terminal, and 20 is an outer case.

In this construction, an SHF signal from a broadcast satellite is fed to the circular waveguide unit 12 through the input flange 11, and propagates through the circular waveguide unit 12, and is converted from the circular transmission mode to a rectangular transmission mode in the circular-rectangular waveguide converter unit 13 to be transmitted to the rectangular waveguide unit 14. The signal then propagates through the rectangular waveguide unit and enters the microwave integrated circuit 16 by way of rectangular waveguide-microstrip line converter unit 15 provided in the final end of the rectangular waveguide unit 14. After necessary signal processing in the microwave integrated circuit 16, it is delivered from the output terminal 19 as a signal of intermediate frequency.

Figure 4:
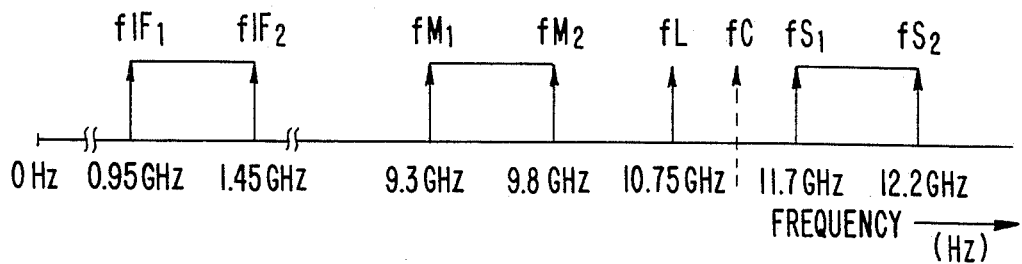
FIG. 4 is a frequency distribution diagram showing the relation of frequencies of the frequency converter for satellite broadcast reception.

An example of the frequency relation of the signals of frequency converter of such construction is shown in FIG. 4. Supposing SHF signals from a satellite within a range of $F_{s1}=11.7$ GHz to $f_{S2}=12.2$ GHz, the local oscillation frequency $f_L$ is set to 10.76 GHz, and the signal of intermediate frequency as output is determined from $f_{IF1}=0.95$ GHz to $f_{IF2}=1.45$ GHz. In this case, the image frequency is within a range of $f_{M1}=9.3$ GHz to $f_{M2}=9.8$ GHz.

The transmission mode of the SHF of circular waveguide unit 12 in FIG. 3 is propagation in the $TE_{11}$ mode which is the principal mode of the circular waveguide. Generally, when the electromagnetic field propagating in a circular waveguide is in the $TE_{11}$ mode, the cutoff wavelength $\lambda_c$ and cutoff frequency $f_c$ are expressed as follows.

$$\lambda_c = \frac{2\pi a}{\dot{x}(m \cdot n)} \quad (1)$$

where a: radius of the circular waveguide
$\dot{x}(m \cdot n)$: the root of Bessel $j'm(\dot{x}[m \cdot n])=0$; in the case of the $TE_{11}$ mode, it is $j'l(\dot{x}(1.1))=0$, and $\dot{x}(m \cdot n)=1.841$.

$$f_c = \frac{c}{\lambda_c} \quad (2)$$

where c: velocity of light.

According to eqs. (1) and (2), in FIG. 3, the radius a of the circular waveguide unit 12 is set to be about 8 mm so that the cutoff frequency $f_c$ of the circular waveguide unit 12 will be lower than the signal $f_{S1}=11.7$ GHz from the satellite and higher than the local oscillation frequency $f_L=10.75$ GHz, being near 11.1 GHz. In this case, the attentuation a applied by the circular waveguide unit 12 to the signal of a frequency lower than the cutoff frequency of the circular waveguide unit 12 is $$a = \frac{2\pi}{\lambda} \sqrt{\left(\frac{\lambda}{\lambda_c}\right)^2 - 1} \quad [Nep/M] \quad (3)$$

where $\lambda$ is a free space wavelength.

Suppose the length of circular waveguide unit 12 in the axial direction to be 50 mm, then the attenuation is about 27 dB at the local oscillation frequency $f_L$ and about 50 dB at the image frequency $f_M$. On the other hand, since the signals from satellite $f_{S1}$ to $f_{S2}$ are hardly attenutated, the circular waveguide unit 12 presents the characteristic of a high pass filter, and the characteristics of image suppression ratio and local oscillation frequency signal leakage required in the frequency converter are extremely improved.

Meanwhile, the internal wavelength $\lambda_g$ of the circular waveguide and characteristic impedance $Z_{wc}$ are expressed as follows.

$$\lambda_g = \frac{\lambda}{\sqrt{1 - \left(\frac{\lambda}{\lambda_c}\right)^2}} \quad (4)$$

$$Z_{wc} = Z_o \frac{\lambda_g}{\lambda} \quad (5)$$

where: $Z_o$ characteristic impedance in free space.

At frequency $f_{S1}=11.7$ GHz of the SHF signal from the satellite, the wavelength and impedance are respectively $\lambda_{g1}=$approx. 85 [mm] and $Z_{wc1}=$approx. 1249 [ohms], and at $f_{S2}=$approx. 12.2 GHz, they are respectively $\lambda_{g2}=$approx. 61 [mm] and $Z_{wc2}=$approx. 930 [ohms]. Thus it is evident that there is a considerable difference in the internal wavelength and characteristic impedance of the waveguide between the frequencies at both ends of the 500 MHz frequency band of the signal. Therefore, it is impossible to effect waveguide-microstrip line conversion with excellent characteristics over the entire region of the 500 MHz of signal bandwidth in this circular waveguide unit 12 alone.

Accordingly, in the present invention, the circular-rectangular waveguide converter unit 13 is provided to convert the transmission mode of the signal from the circular mode $TE_{11}$ to $TE_{10}$ which is the principal mode of the rectangular waveguide.

Figure 5A:
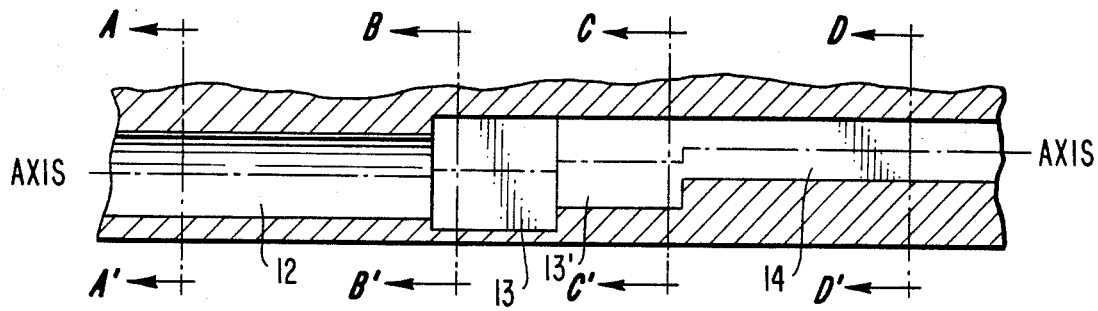
Figure 5B:
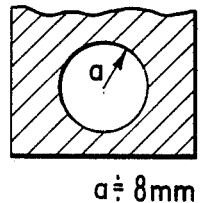
Figure 5C:
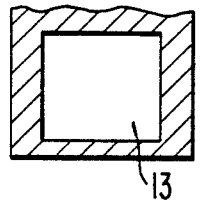
Figure 5D:
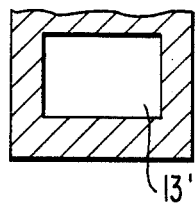
Figure 5E:
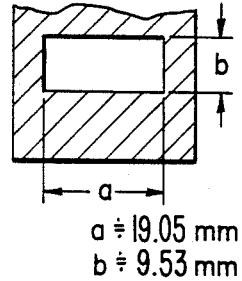

The section of the rectangular waveguide unit 14 after rectangular conversion is shown in section D—D' in FIG. 5E. The internal wavelength $\lambda_g$ and characteristic impedance $Z_{WR}$ of the rectangular waveguide unit 14 having this section are expressed as follows.

$$\lambda_g = \frac{\lambda}{\sqrt{1 - \left(\frac{\lambda}{2a}\right)^2}} \quad (6)$$

$$Z_{WR} = Z_o \cdot \frac{2b}{a} \cdot \frac{\lambda_g}{\lambda} \quad (7)$$

That is, at frequency $f_{S1}=11.7$ GHz of the SHF signal, the wavelength is $\lambda_g=$approx. 35 [mm] and impedance is $Z_{WC}=509$ [ohms], and at $f_{S2}=12.2$ GHz, they are respectively $\lambda_g=32$ [mm] and $Z_{WC}=493$ [ohms], and there is no significant difference in the frequency between the two ends of the 500 MHz band.

In the final end part of the rectangular waveguide unit 14 in FIG. 3, the rectangular waveguie-microstrip line converter unit 15 is provided, and the rectangular waveguide-microstrip line conversion is effected easily, and the signals from the satellite are introduced into the microwave integrated circuit 16.

On the other hand, regarding the circular-rectangular waveguide conversion, as mentioned above, since the difference in the characteristic impedance between the circular waveguide unit 12 and the rectangular waveguide unit 14 is relatively large, it is expected to be difficult to convert efficiently over the entire signal band of 500 MHz by a single step conversion alone. Therefore, in such a case, an efficient conversion may be achieved by using a two-step converter.

What is particularly notable in this embodiment of the circular-rectangular waveguide converter unit 13 is that not only is the circular-rectangular converting function provided, but also the axis of the circular waveguide unit 12 and that of rectangular waveguide unit 14 are offset parallel to the shorter side direction of the rectangular waveguide unit 14 by properly selecting the dimensions of the circular-rectangular converter unit.

Details of the circular-rectangular waveguide unit 13 are shown in FIGS. 5A to 5E. As understood from the drawing, the $TE_{11}$ mode of circular waveguide unit 12 is first converted to the mode of rectangular waveguide unit possessing the characteristic impedance of high impedance by the step converter 13 of the first step, and is then converted to the rectangular transmission mode $TE_{10}$ of low impedance gradually through the second step converter 13'.

Figure 6A:
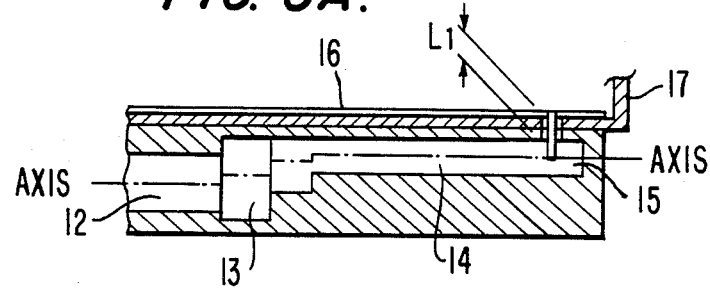
Figure 6B:
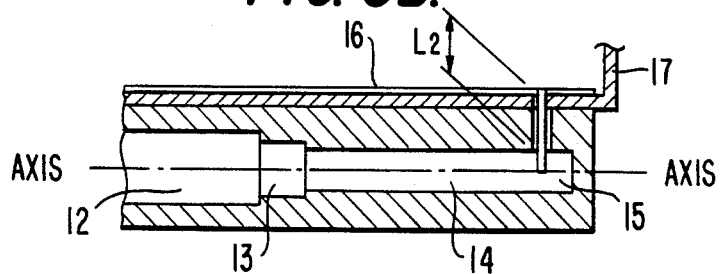

FIG. 6b shows a waveguide unit for circular-rectangular waveguide conversion. In this case, the axis of the circular waveguide unit 12 and that of rectangular waveguide unit 12 coincide with each other.

Although it is possible to use in the same shape and state as shown in FIG. 6b, the dimension L2 is enlarged when applied to a frequency converter, and the attenuation of the signal becomes larger as compared with the dimension of L1 in the rectangular waveguide-microstrip line converter unit 15, which may give rise to deterioration of the noise index characteristic required in the converter. Hence, when an advanced characteristic is required, as shown in FIG. 6a, the circular-rectangular waveguide converter unit 13 is provided with both a circular-rectangular waveguide converting function and the function to move the axis of the waveguide parallel in the direction parallel to the shorter side of the rectangular waveguide, and the dimension of L1 in FIG. 6a is minimized to prevent deterioration of the noise index.

Though the example above relates to a two-step operation of circular-rectangular waveguide conversion, it is generally most natural to use tapered waveguide in the circular-rectangular mode conversion, and the reflection is decreased as a matter of course when gradually converted from the circular to the rectangular mode.

An embodiment using tapered waveguide is shown in FIGS. 7A to 7E. As shown in FIG. 7A, the mode is converted from circular to rectangular by a tapered waveguide 13A having a certain inclination $\theta$ relative to the axis of the circular waveguide unit 12, and the axis of circular waveguide unit 12 and that of rectangular waveguide unit 14 are simultaneously shifted while remaining parallel.

In addition to the frequency converter in which the signals received from the satellite are fed in the $TE_{11}$ mode of circular waveguide explained so far, an embodiment is possible in which signals are fed in the $TE_{10}$ mode of rectangular waveguide as shown in FIG. 8.

In FIG. 8, using the concept of feeding inputs in the $TE_{10}$ mode of the rectangular waveguide, a converter unit (which is a rectangular-circular waveguide converter unit 22) identical in shape with the circular-rectangular waveguide unit in FIG. 3 is placed before the circular waveguide unit 12 shown in FIG. 3, and a rectangular waveguide unit 21 is provided before this rectangular-circular waveguide converter unit 22. In this construction, the reception signal fed from the input flange unit 11 propagates through the rectangular waveguide unit 21 in the $TE_{10}$ mode, and is converted to the $TE_{11}$ mode of the circular waveguide unit 12 in the rectangular-circular waveguide converter unit 22, and is applied into the circular waveguide unit 12 which acts as a high pass filter. The subsequent operation is same as in the explanation of FIG. 3.

Figure 9A:
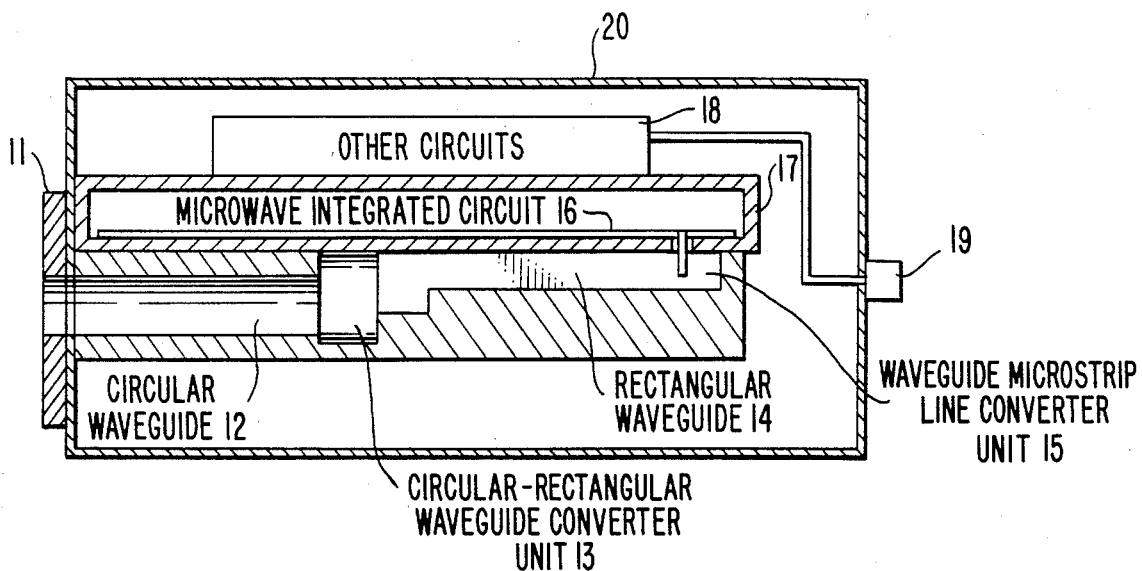
FIGS. 9A and 9B are sectional views of the frequency converter according to further embodiments.
Figure 9B:
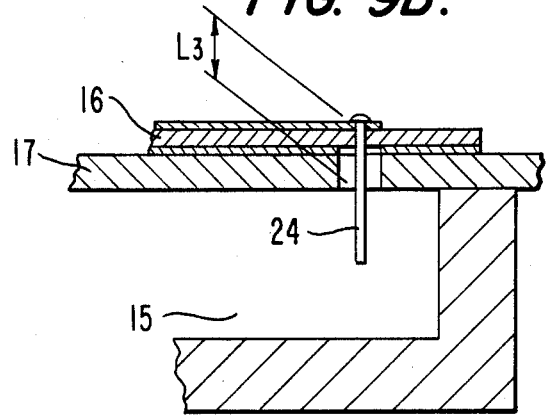

Another embodiment is shown in FIGS. 9A and 9B. This embodiment is intended to satify the image suppression ratio, leakage prevention of the local oscillation signal, and noise index characteristic, and also to reduce the size of the frequency converter. For these purposes, the H-wall of the circular-rectangular waveguide converter unit 13 and rectangular waveguide converter unit 14 in FIG. 3 is composed of shield case 17 of the microwave integrated circuit 16. The construction of the other parts is the same as in FIG. 3. In this construction, as shown in the detailed view in FIG. 9B, the dimension L3 in the rectangular-microstrip line converter unit 15 may be further reduced, and the signal attenuation in this part may be held to a minimum, and the size of the equipment may be reduced without causing deterioration of the noise index characteristic.

Figure 10:
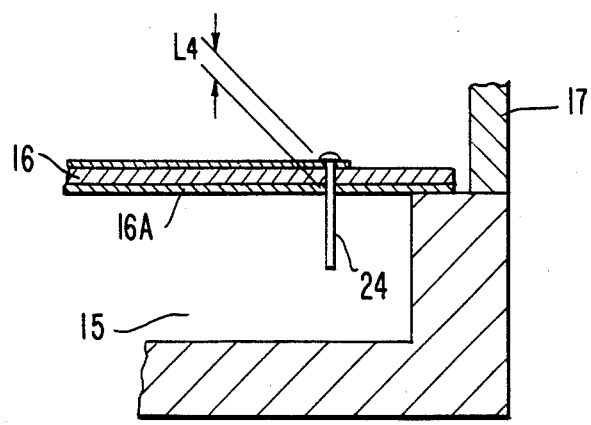
FIG. 10 is a sectional view of an important part of the frequency converter of another embodiment.

Another embodiment is shown in FIG. 10. In this construction, the H-wall of the circular-rectangular waveguide converter unit 13 and rectangular waveguide unit 14 in FIG. 3 is composed of grounding plate 16A of the dielectric substrate as used in the microwave integrated circuit 16. In this construction, the dimension L4 may be further decreased, so that the size may be much smaller. Meanwhile, in FIGS. 9 and 10, the operation is similar to that of previous embodiments, and numeral 23 in FIGS. 9 and 10 refers to a probe mounted on the microwave integrated circuit 16.

The technique in FIGS. 9 and 10 may be applied to the embodiment in FIG. 7.

POSSIBILITIES OF INDUSTRIAL USES

According to the present invention, as disclosed above, by installing a circular waveguide unit having high pass filter characteristics and providing the circular waveguide unit and rectangular waveguide unit in an axially offset configuration, a high performance frequency converter satisfying all the requirements of image suppression ratio, leakage prevention of local oscillation signals, and noise index characteristic may be obtained, and it is particularly suitable for use in satellite broadcast reception.

What is claimed is:

1. A frequency converter comprising:
    an unobstructed circular waveguide unit through one end of which received signals are fed thereto and conveying signals in the TE11 mode at an output end;
    a rectangular waveguide unit having a rectangular waveguide-microstrip line converter unit in its output end and conveying signals in the TE10 mode;
    a circular-rectangular waveguide converter unit connecting the output end of said circular waveguide unit and an input end of said rectangular waveguide unit to convert the mode of transmission of signals from the TE11 mode in the circular waveguide unit to a principal transmission mode TE10 in the rectangular waveguide unit; and a microwave integrated circuit extending in the direction of and on the H-wall side of said circular-rectangular waveguide converter unit and said rectangular waveguide unit and connected to said rectangular waveguide-microstrip line converter unit for processing the received signals and delivering the received signals as signals of an intermediate frequency;

said circular waveguide unit having a diameter to provide a cutoff frequency of said circular waveguide unit to be lower than the frequency of the received signals and higher than a local oscillation frequency for causing said circular waveguide unit to function as a high pass filter, and the axis of said rectangular waveguide unit being offset relative to that of said circular waveguide unit in the direction parallel to the shorter side of said rectangular waveguide unit and toward the H-wall along which said microwave integrated circuit is positioned.

2. A frequency converter as claimed in claim 1 wherein said circular-rectangular waveguide converter unit comprises a first step converter having a characteristic impedance which is a high impedance and being for converting the TE11 mode of the circular waveguide to the principal transmission mode TE10 of the rectangular waveguide unit, and a second step converter for converting said transmission mode TE10 to another transmission mode TE10 of lower impedance.

3. A frequency converter as claimed in claim 1 wherein said circular-rectangular waveguide converter unit is a tapered waveguide which is at a predetermined angle with respect to the axis of said circular waveguide unit.

4. A frequency converter as claimed in claim 1 wherein said microwave integrated circuit comprises a shield case on which the integrated circuit is mounted, at least one of said circular-rectangular waveguide converter unit and said rectangular waveguide unit being at least partly defined by said shield case.

* * * * *